US006891442B2

(12) United States Patent
Allen et al.

(10) Patent No.: US 6,891,442 B2
(45) Date of Patent: May 10, 2005

(54) RING OSCILLATOR GATES IN A MATRIX FOR ABERRANT LOGIC GATE TIMING DETECTION

(75) Inventors: Andrew E. Allen, Portland, OR (US); Samie B. Samaan, Lake Oswego, OR (US); Robert M. Spencer, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/610,856

(22) Filed: Jun. 30, 2003

(65) Prior Publication Data

US 2004/0263265 A1 Dec. 30, 2004

(51) Int. Cl.[7] ............................................. H03B 27/00
(52) U.S. Cl. ........................ 331/57; 327/284; 327/269
(58) Field of Search ........................... 331/57, 17, 1 A, 331/25; 327/284, 277, 269; 375/375, 376

(56) References Cited

U.S. PATENT DOCUMENTS

| 5,475,344 | A | * | 12/1995 | Maneatis et al. | ............. 331/57 |
| 5,592,127 | A | * | 1/1997 | Mizuno | ....................... 331/57 |
| 5,923,838 | A | * | 7/1999 | Hongo | ......................... 714/42 |
| 6,081,147 | A | * | 6/2000 | Okajima | ..................... 327/284 |
| 6,104,253 | A | * | 8/2000 | Hall et al. | ..................... 331/56 |
| 6,222,406 | B1 | * | 4/2001 | Noda et al. | .................. 327/269 |
| 6,310,523 | B1 | * | 10/2001 | Chen et al. | .................. 331/57 |
| 6,535,013 | B2 | | 3/2003 | Samaan | |

* cited by examiner

Primary Examiner—Robert Pascal
Assistant Examiner—Joseph Chang
(74) Attorney, Agent, or Firm—Schwabe, Williamson & Wyatt, P.C.

(57) ABSTRACT

An array of circuitry forming row and column ring oscillators is provided to determine aberrant gates in an integrated circuit. Control logic is coupled to the rows and columns to enable a ring oscillator of either a row or a column to oscillate. Based on outputs of these oscillations, aberrant gates in an integrated circuit may be more readily studied.

30 Claims, 13 Drawing Sheets

| $N_X$ | $I_A$ | $I_B$ | $I_C$ | $I_D$ |
|---|---|---|---|---|
| $I_D$ | $N_X$ | $I_A$ | $I_B$ | $I_C$ |
| $I_C$ | $I_D$ | $N_X$ | $I_A$ | $I_B$ |
| $I_B$ | $I_C$ | $I_D$ | $N_X$ | $I_A$ |
| $I_A$ | $I_B$ | $I_C$ | $I_D$ | $N_X$ |

FIG. 11A

| $N_X$ | $I_A$ | $I_B$ | $I_C$ | $I_D$ |
|---|---|---|---|---|
| $I_B$ | $N_X$ | $I_D$ | $I_A$ | $I_C$ |
| $I_A$ | $I_C$ | $N_X$ | $I_D$ | $I_B$ |
| $I_D$ | $I_B$ | $I_C$ | $N_X$ | $I_A$ |
| $I_C$ | $I_D$ | $I_A$ | $I_B$ | $N_X$ |

FIG. 11B

RING OSCILLATOR GATES IN A MATRIX FOR ABERRANT LOGIC GATE TIMING DETECTION

FIELD OF THE INVENTION

The present invention relates generally to the fields of integrated circuit manufacturing and design. Specifically, the present invention relates to the detection of aberrant logic gate timing.

BACKGROUND OF THE INVENTION

Aberrations in manufacturing processes of integrated circuits may result in various types of abnormalities in the circuit performance. Certain aberrations can result in functional failures of the design. However, certain other aberrations may result in circuits that, while free from functional failures, operate at a frequency that is slower than that expected for the design.

These aberrations in performance may result from logic gates containing variations in their device parameters or from various other causes. Parametric variations include variations in channel length and effective width. These variations, in turn, cause variations in the logic path delays. Variations in logic path delays are becoming relatively larger as manufacturing processes, and thus feature sizes, decrease. This variation in logic path delays is bringing about difficulty in converging chip timing and in meeting the desired operating frequency. Further, due to minimum delay violations, functional failures may eventually ensue.

Various methods have been devised to detect when performance-based variations may affect a circuit. For example, "at-speed" Automated Test Pattern Generation (ATPG) can be utilized to determine when critical paths in a circuit have maximum operating frequencies that do not meet operating frequencies specified for the circuit. However, such tests only provide an indication of a problem, these tests do not aid in identifying the gate (or gates) associated with the problem. Other methods have been devised for attempting to narrow the location of gates that have aberrant timing. However, these methods have largely produced procedures for general area identification.

BRIEF DESCRIPTION OF THE FIGURES

Examples of the present invention are illustrated in the accompanying drawings. The accompanying drawings, however, do not limit the scope of the present invention. Similar references in the drawings indicate similar elements.

FIGS. 11A–11B illustrate graphically the structure of a matrix comprising different gate types, in accordance with multiple embodiments.

DETAILED DESCRIPTION OF THE PREFERRED EMBODIMENTS

In the following description, various embodiments of the invention will be described. However, it will be apparent to those skilled in the art that the invention may be practiced with only some or all features described in various embodiments of the invention. For purposes of explanation, specific numbers, materials and configurations are set forth in order to provide a thorough understanding of these embodiments. However, it will also be apparent to one skilled in the art that embodiments of the invention may be practiced without the specific details. In other instances, well-known features are omitted or simplified in order not to obscure the invention.

The following embodiments will be described with reference to specific logic levels and gate types for illustration purposes only. As one skilled in the art will recognize, other logic levels and gate types can be utilized to achieve like results. In addition.

The accompanying figures illustrate various features of various embodiments of the present invention. Several of these utilize schematics to illustrate circuits. Certain of the illustrations show non-connecting signal routes as bubbled whereas others do not. It will be understood in the context of each drawing where electrical connectivity is to occur.

While the embodiments described herein are presented in the context of IGFET silicon integrated devices and circuits, such as CMOS, other embodiments using different process, device or circuit technologies could be used to realize the structure described herein. For instance, bipolar process, device and circuit techniques could be used to realize the matrix structure of the ring oscillator rows and columns. Similarly, analog circuits instead of digital circuits can be used to implement the function of the various embodiments presented herein.

As described by the embodiments below, a number of circuit blocks containing a matrix of ring oscillators and supporting logic are placed throughout an integrated circuit design. These circuit blocks may be utilized to perform analysis of the integrated circuit design including advantageously identifying aberrant logic gate timing.

Figure 1:
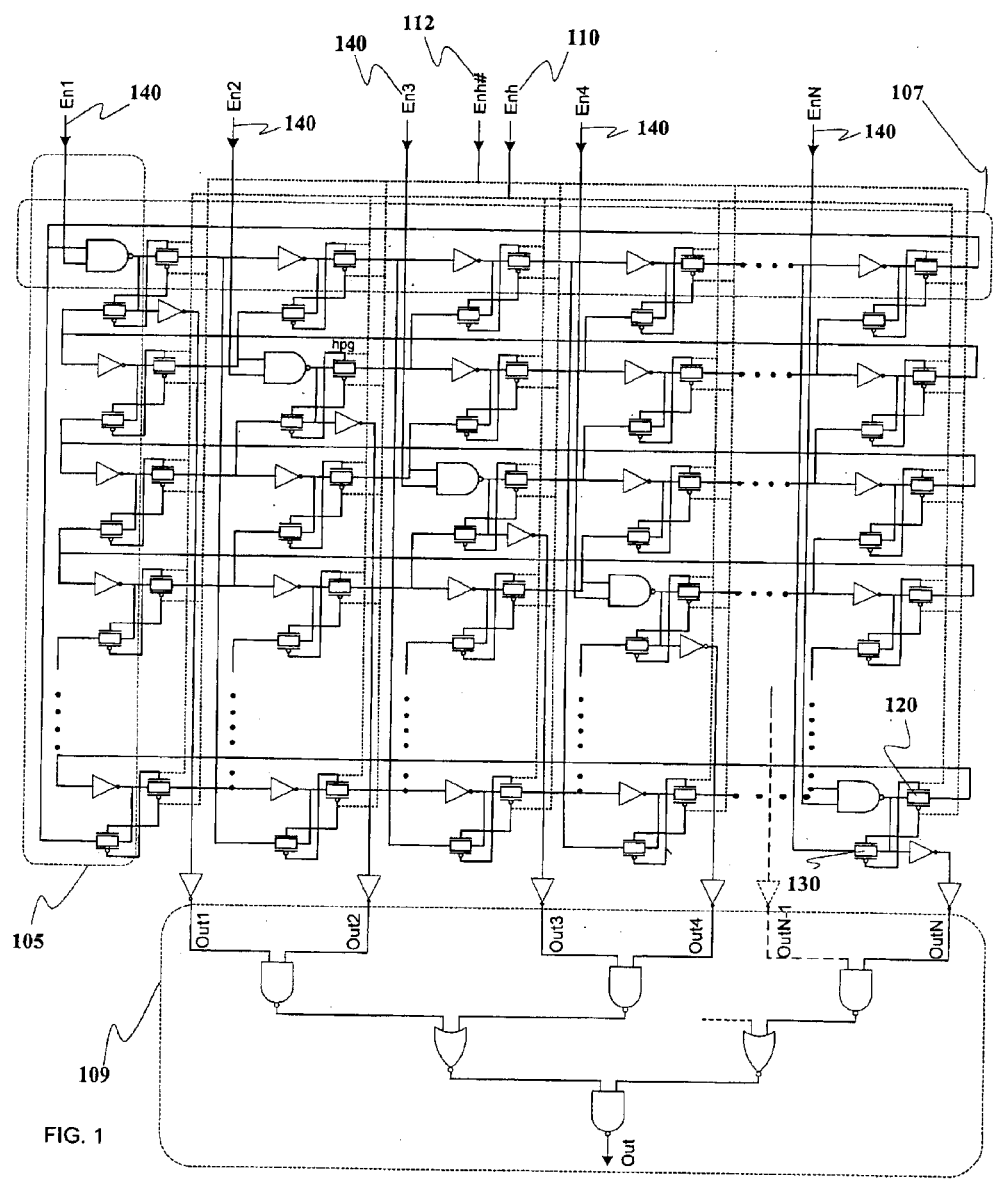
FIG. 1 illustrates a matrix utilized for aberrant logic gate timing identification, in accordance with one embodiment.

FIG. 1 illustrates a matrix utilized for identifying aberrant logic gate timing, in accordance with one embodiment. In this matrix, there are a number of columns 105 and rows 107 of inversion stages. Inversion stages may include inverting logic stages such as inverters and other digital logic devices or analog signal inversion circuit. Each column of inversion stages forms a ring oscillator, referred to herein as column ring oscillator. Similarly, each row of inversion stages forms a ring oscillator referred to herein as a row ring oscillator. In each row and column there will be an odd number of inversion stages. While typically five, seven or nine inversion stages provide a reasonable size matrix for evaluation, any odd number, greater than two, of inversion stages may be used. In addition, while the embodiments illustrate row ring oscillators and column ring oscillators with equal numbers of inversion stages, row ring oscillators and column ring oscillators having different odd numbers, N and M, of inversion stages may be utilized.

Outputs from the row ring oscillators and column ring oscillators are fed to output circuitry 109 where an output may be generated for the matrix. As will be discussed later in further detail, two enable signals Enh 110 and Enh# 112 are utilized to enable a plurality of row pass gates 120 and column pass gates 130 in the matrix. The number, N, of enable signals 140 are utilized, in combination with the row 120 and column 130 pass gates, to enable one of the row ring oscillators or column ring oscillators. This enabled ring oscillator provides a test signal, to be described further subsequently.

Figure 2:
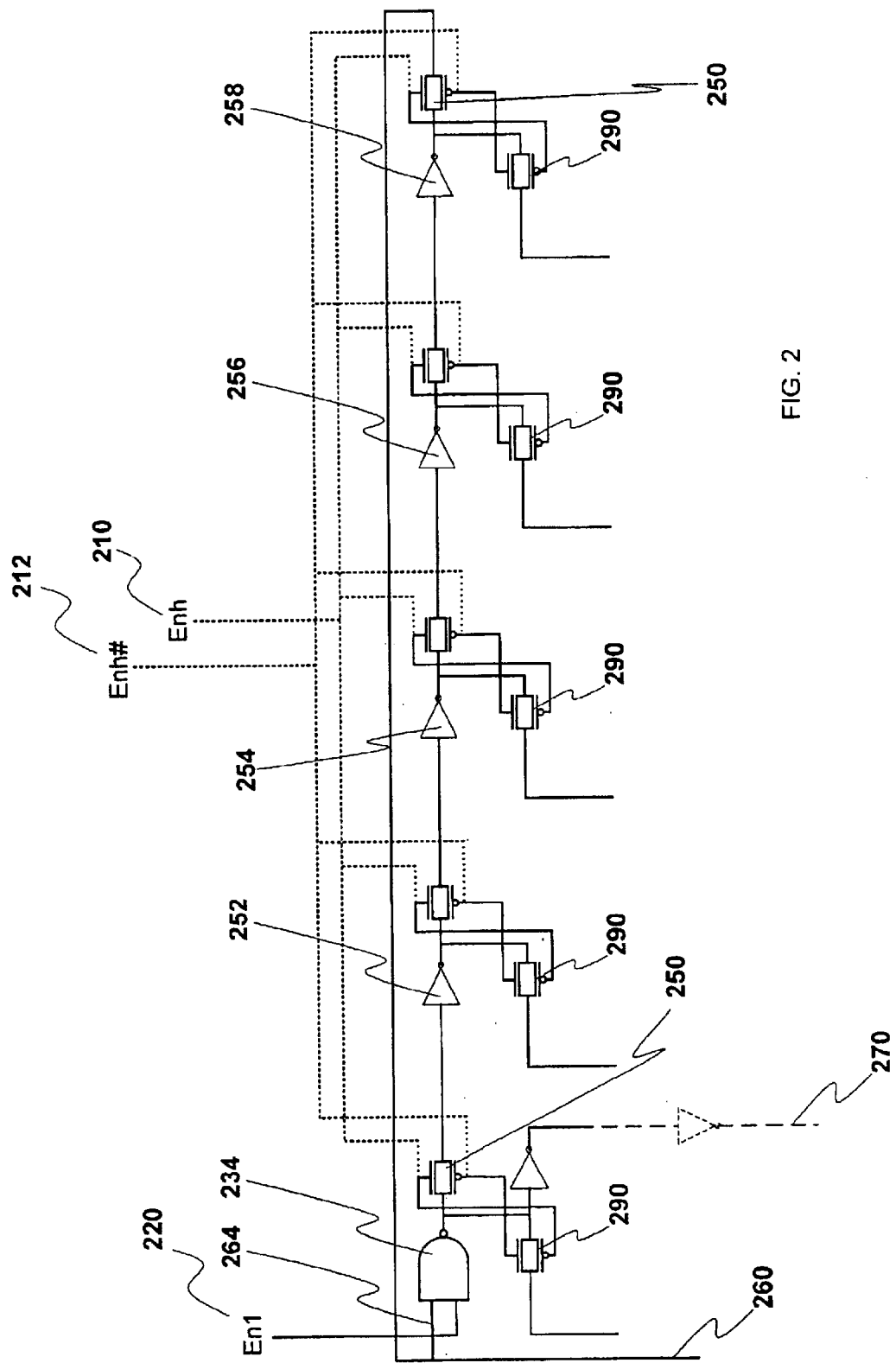
FIG. 2 illustrates a row ring oscillator from a five inversion stage matrix, in accordance with one embodiment.

FIG. 2 illustrates a row ring oscillator from a five inversion stage matrix, in accordance with one embodiment. Four of the inversion stages are provided by inverters 252–258. One inversion stage may be provided by NAND gate 234. The NAND gate 234 may be utilized together with an enable signal, EN1 220, to enable or disable the row ring oscillator. By de-asserting the enable signal 220, e.g. assigning a logic "0", the output of the NAND gate may be held constant to a logic "1", which, in the present embodiment, causes the row ring oscillator to be disabled. By asserting the enable signal, e.g. assigning a logic "1", the output of the NAND gate 234, in this embodiment, is allowed to "toggle" based on the value of the other input to the NAND gate 234. This other input 264 to the NAND gate 234 is the output from the prior inversion stage. Thus, when enabled, the inversion stages operate as a ring oscillator. As one skilled in the art will recognize, other structures, such as NOR gates may be used to disable the row and column ring oscillators.

Note that for the row ring oscillator illustrated in FIG. 2 to run, in addition to the enable signal 220 being asserted, row pass gates 250 are enabled. Each of the inversion stages has a row pass gate 250 coupling it horizontally with the next inversion stage. For example, NAND gate 234 has pass gates 250 providing horizontal coupling with the previous inversion stage 258 and the subsequent inversion stage 252. All of the row pass gates are driven by two signals Enh 210 and Enh# 212. Thus, to enable the row pass gates, Enh 210 and Enh# 212, wherein Enh 210 and Enh# 212 are logically inverted with respect to one another, are asserted, e.g. logic "1" and "0" respectively. As will be described subsequently, in the embodiment shown, upon such an assertion, the column pass gates 290 are disabled.

While the embodiments described herein are presented in the context of using CMOS pass-gates to control the communication between the row and column inversion stages, other circuits could be used to achieve the same purpose. A benefit of using CMOS pass-gates is that they introduce a relatively low number of devices to achieve the communication control function.

Figure 3:
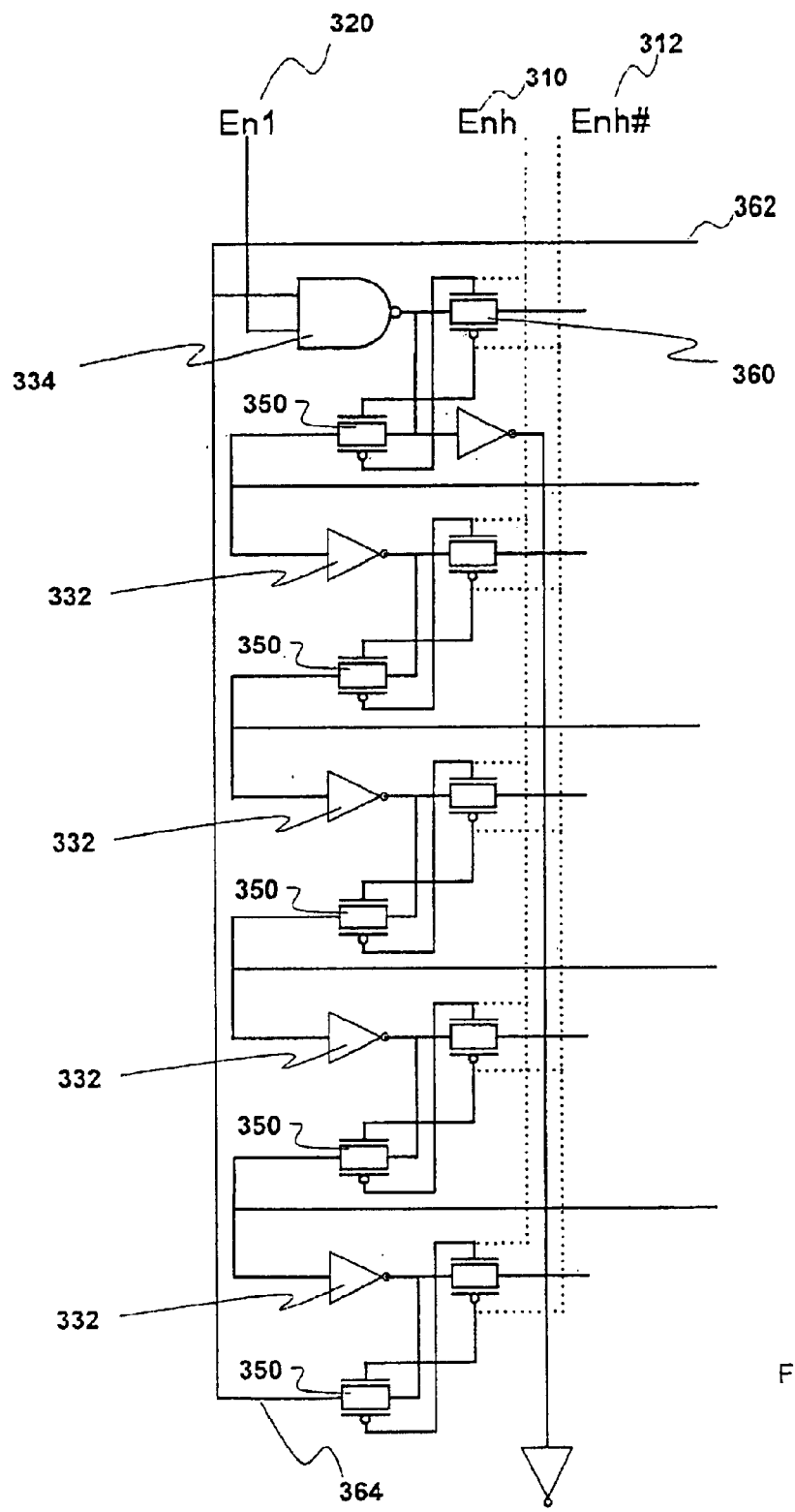
FIG. 3 illustrates a column ring oscillator from a five inversion stage matrix, in accordance with one embodiment.

FIG. 3 illustrates a column ring oscillator from a five inversion stage matrix, in accordance with one embodiment. Similar to the row ring oscillator previously discussed, the column ring oscillator of this embodiment comprises five inverting stages of which there are four inverters 332 and one NAND gate 334. As with the row ring oscillator, the NAND gate 334 acts as a switch for determining when a column ring oscillator is enabled. Thus, the column ring oscillator illustrated is enabled when the enable signal, En1 320, is asserted allowing the column ring oscillator to run, assuming proper pass gate enablement described below.

Note that, in a manner similar to that of the row oscillator, the column ring oscillator of FIG. 3 is further enabled by column pass gates 350. Each of the inversion stages, both the inverters 332 and the NAND gate 334, has a column pass gate coupling it vertically with the next inversion stage. These column pass gates 350 are driven by two signals, Enh 310 and Enh# 312, wherein Enh 310 and Enh# 312 are logically inverted with respect to one another. As configured, when Enh 310 and Enh# 312 are de-asserted, logic "0" and logic "1", respectively, pass gates 350 are enabled, and the column ring oscillator is allowed to run. In the embodiment illustrated, Enh 310 and Enh# 312 are also utilized to drive pass gates 360 associated with row ring oscillators. The configuration of Enh 310 and Enh# 312 is inverted with respect to the pass gates associated with the row ring oscillators. When the Enh 310 and Enh# 312 are de-asserted, logic "0" and logic "1", respectively, the row pass gates 360 do not allow signals to pass. Thus, when Enh 310 and Enh# 312 are de-asserted the row ring oscillators are disabled.

The two pass gates associated with each inversion stage may not simultaneously drive the input to that inversion stage. For example, NAND gate 334 is driven by row ring oscillator signal 362 and column ring oscillator signal 364. Each of these two signals is driven by a row pass gate and column pass gate, respectively. By having the enable signals of the row pass gate and column pass gate driven in a mutually exclusive manner, only one direction is enabled.

The embodiment shown illustrates the use of two signals to provide enable signals for the pass gates in both the row and column ring oscillators. It is understood that four signals could be used to drive the enable signals, where two signals may be used for the row ring oscillators and two signals may be used for the column ring oscillators.

Figure 4:
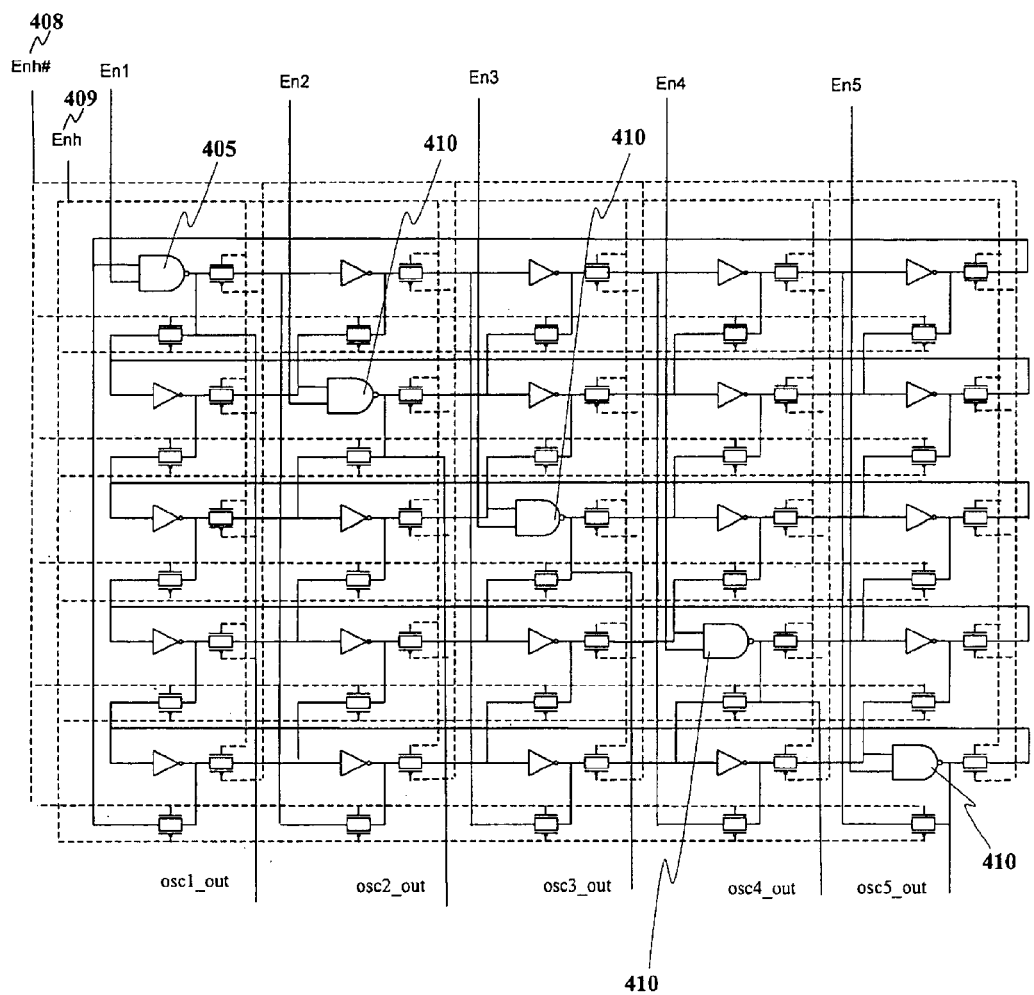
FIG. 4 illustrates a matrix including five row ring oscillators by five column ring oscillators, in accordance with one embodiment.

FIG. 4 illustrates an inversion stage matrix organized into five row ring oscillators by five column ring oscillators, in accordance with one embodiment. NAND gate 405 is part of a row ring oscillator, row 1, and a column ring oscillator, column 1. In the embodiment illustrated, to facilitate the presence of one NAND gate in each row and column ring oscillator, NAND gates 405 410 exist on the primary diagonal for the matrix. The output of each NAND gate operates as a valid output for each row/column combination, where either the row or column is selected based on the Enh# 408 and Enh 409 signals.

Figure 5:
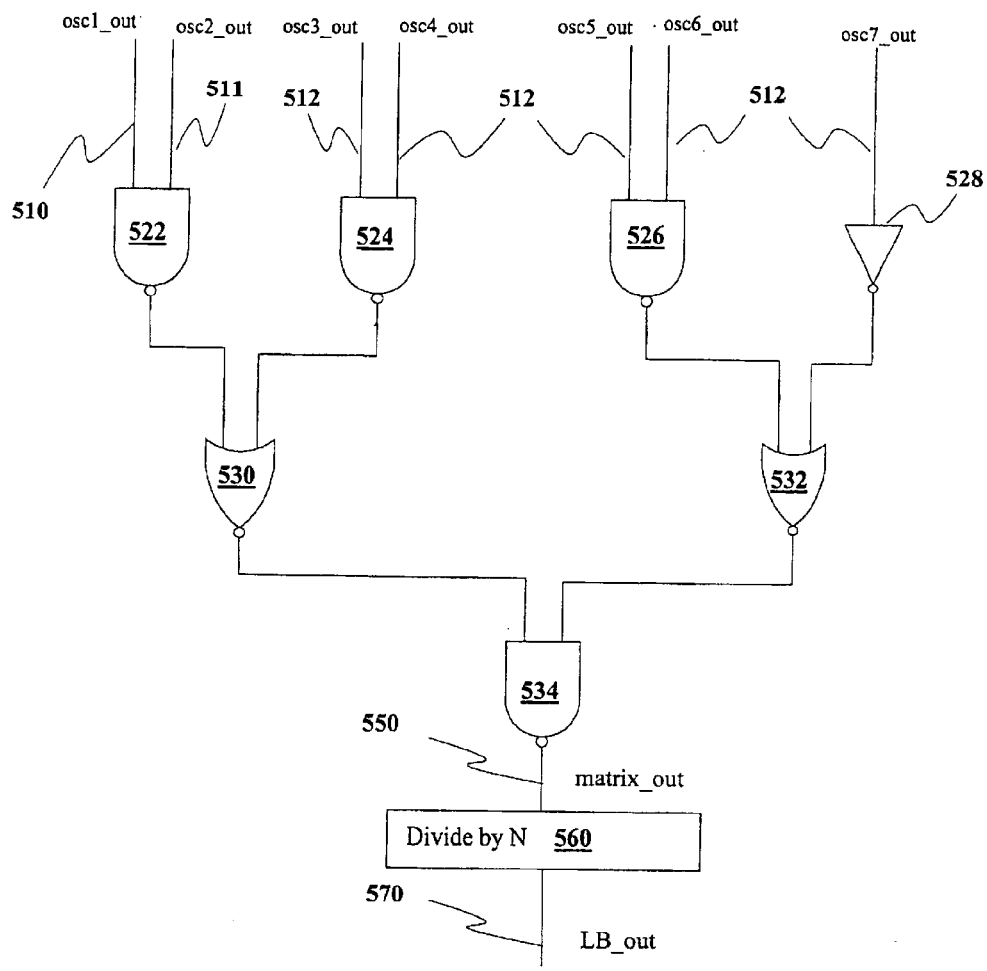
FIG. 5 illustrates an output logic stage for a matrix containing seven ring oscillator output signals, in accordance with one embodiment.

FIG. 5 illustrates an output logic stage for a matrix containing seven ring oscillator output signals, in accordance with one embodiment. This structure allows for an oscillating value on one output 510–512 to pass through to the output signal matrix_out 550. In this embodiment, a NAND/NOR logic structure is used to facilitate the output of the currently enabled ring oscillator. In this embodiment, when oscillators are disabled, the output of the oscillators remains at a constant logic "1". For example, assume that the oscillator driving single line osc1_out 510 is enabled and that the remaining oscillator signal lines 511–512 are disabled. The output of a logic "1" from oscillator 511 allows the oscillating signal 510 to "pass" through gate 522. The remaining oscillator output signals 512 propagate through logic gates 524–534 in a manner to allow the oscillating signal 510 to propagate to output matrix_out 550. In this manner, the circuitry provides a multiplexer function for providing an output. In the case where no enable signals are asserted, as may be the case when another matrix structure may be producing an oscillation signal, constant logic "1"'s on all oscillator output signals 510–512 may drive matrix_out 550 to a known value.

In an alternative embodiment, no multiplexing output logic is utilized. In such a case, each oscillator output signal 510–512 is provided to the outputs. Downstream logic outside of the local matrix may perform post processing to determine an active output signal.

A ring oscillator may result in very fast signal transitions. In various embodiments, the frequency of the ring oscillator output may be reduced as it travels from the matrix to a subsequent point. In the embodiment illustrated in FIG. 5, the matrix_out value is divided down using a frequency divider circuit 560, to provide a lower frequency signal. This lower frequency signal 570 from the logic block can be more easily transmitted throughout the integrated circuit design, while maintaining proportionality to the actual oscillator frequency.

Analysis of the matrix output may provide information related to gate delays. For example, assume an N row by N column matrix comprising 2N ring oscillators. If any one of the inverting stages that make up one of the 2N ring oscillators switches at an unusually high or low delay, then the frequency of any ring oscillator which employs such inverting stage may deviate significantly from its expected frequency. Such a deviation may be ascertained by statistically analyzing the frequencies of the 2N ring oscillators and looking for unusual outliers. Whenever a gate of interest is the one manifesting aberrant timing behavior, a deviation may be noticeable on both a row ring oscillator and a column ring oscillator. In one embodiment, the gate that both the row and column have in common may be the gate manifesting aberrant timing behavior. In this manner, the aberrant delay can be attributed to a single gate. In the case of a simple static Complementary Metal Oxide Semiconductor (CMOS) inverter, this can ascribe the aberration to two transistors. As discussed subsequently, it is possible to capture the oscillation signal for subsequent processing elsewhere on an integrated circuit, while another option is to provide the oscillation signal to a location off the integrated circuit to allow for processing by other methods.

Note that, in the embodiment illustrated, pass gates are used in the signal path of the ring oscillators. Thus, it is possible that these pass gates could be the cause of a frequency anomaly in a ring oscillator. However, the pass gates reside on either a row ring oscillator or a column ring oscillator. Thus, anomalous frequencies caused by a single pass gate may affect either a row or a column, but not both. Hence, identification of a single inversion stage may be possible when the aberrant behavior is caused by a "gate of interest", e.g. part of an inversion stage, instead of the pass-gates.

It is possible that two or more pass gates may have aberrant behavior simultaneously in one matrix. However, it is statistically less frequent to have such simultaneous multiple aberrations. Nevertheless, such an occurrence could cause a false indicator that a gate of interest is aberrant. Resultantly, care should be taken during the design of the pass gates to reduce the probability that they deviate much from each other.

While any number of inversion stages necessary to form a ring oscillator may be used, recommended numbers of stages are five, seven, or nine. The reason is, generally, the larger the number of inversion stages in a ring oscillator, the smaller is the impact of any one aberrant gate's delay on the frequency of the oscillator. This means that the aberration may be less discernable in an embodiment of which the ring oscillators contain a large number of inversion stages. In addition, the longer a ring oscillator, e.g. the more inversion stages, the larger is the natural absolute random variation in its frequency of oscillation, due to random within-die process variation phenomena (such as random threshold and random channel length variations), which may make it more difficult to detect an aberrant gate of interest.

Figure 6:
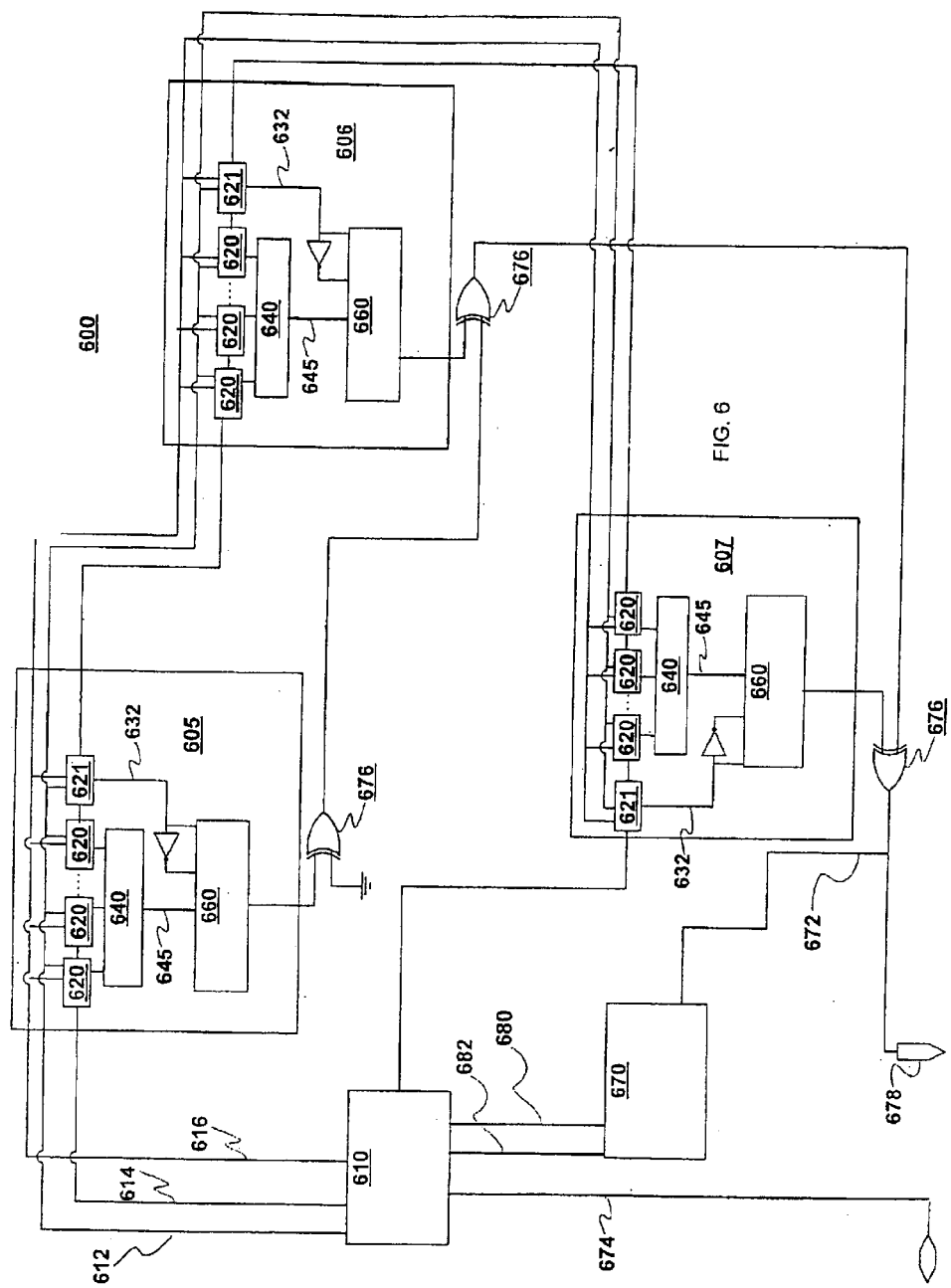
FIG. 6 illustrates an integrated circuit design containing a number of matrices with accompanying logic, in accordance with one embodiment.

FIG. 6 illustrates an integrated circuit design containing a number of matrices with accompanying logic, in accordance with one embodiment. In this embodiment, three circuit blocks 605–607 are illustrated, however the number of circuit blocks may vary depending upon the implementation. Circuit blocks 605–607 are placed at locations in the integrated circuit 600 to facilitate monitoring of, among other things, aberrant gate timing. These placements can be either opportunistic, e.g. based on available area, or they can be targeted placements.

In the embodiment shown, a modified Test Access Port (TAP) controller 610 may be utilized to provide logic to drive the testing as described herein. The TAP controller receives input signals from external interface 674. Test data in (TDI) signal 614 may be used to scan in bit patterns to registers 620–621 of the circuit blocks 605–607. For the illustrated chain, a bit pattern may be scanned in to either disable all ring oscillators or enable a single ring oscillator in one of the circuit blocks 605–607. In addition, the scanned in bit pattern may provide an enable signal for the pass gates in the enabled logic block. Test Clock (TCLK) 612 may be propagated to the circuit blocks and may be utilized to clock the pattern into the registers 620–621. Test Reset (TRST) 616 may be also propagated to the circuit blocks 605–607 and may be utilized to reset registers 620–621. Decode logic 640 may be used to generate enable signals 645 for matrix 660 from registers 620. Whereas register 621 may be utilized to generate the enable signals 632 for the pass gates of the matrix.

Figure 7:
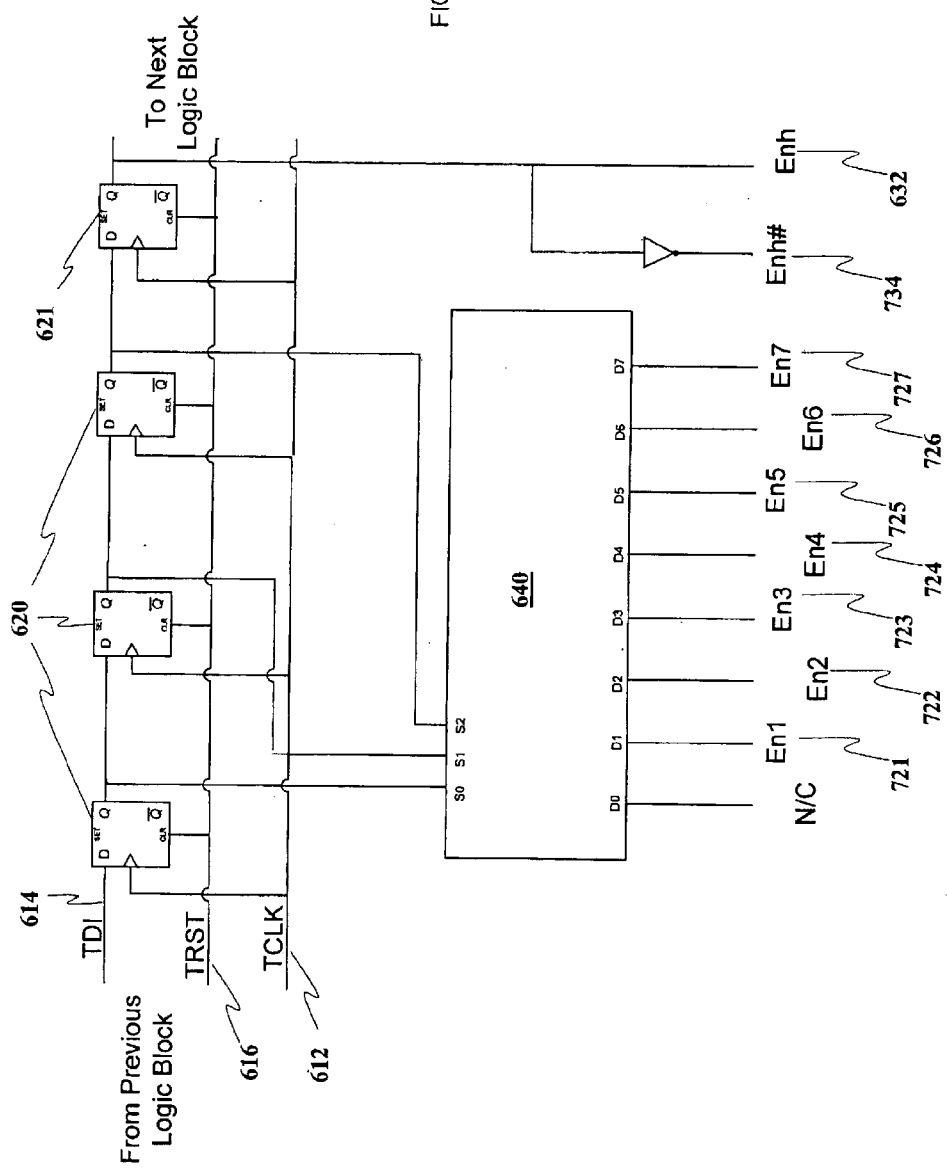
FIG. 7 illustrates decode logic for a logic block in accordance with one embodiment.

FIG. 7 illustrates a more detailed look at registers 620–621 and decode logic 640 for a logic block, in accordance with one embodiment. TCLK 612 may be utilized to clock-in test data. The test data arrive via the TDI signal 614, and may be serially shifted through registers 620–621. The data received by the registers 620 may be then provided to a three-to-eight decoder 640 which decodes the three-bit pattern of registers 620 to establish enable signals En1–En7 721–727. If the logic block does not contain any row or column oscillator that is to be enabled, perhaps either because there are no ring oscillator tests being performed or another logic block contains an active ring oscillator, then the three-to-eight decoder 640 may contain all de-asserted enable signals. If, as a result of the newly shifted-in value to the shift registers, one row or column oscillator is to generate an oscillating test signal, then one of the enable signals En1–En7 721–727 may be asserted. Register 621 provides the Enh 632 which may be used to derive Enh# 734.

Referring again to FIG. 6, interconnect logic may be utilized to propagate a test data signal generated by a logic block through the circuit blocks 605–607; i.e. circuit blocks 605–607 may be "chained" together via interconnect logic. In such an embodiment, during testing of an integrated circuit, for a given set of circuit blocks on a chain, there may be one ring oscillator actively generating a test data signal. In the embodiments shown, exclusive-OR gates 676 may be utilized as part of the interconnect logic to provide an output path for the test data signal. As only one logic block may contain an oscillating signal for a given path, the exclusive-OR network may provide a low overhead approach to propagating the test data signal through all circuit blocks. The output from an activated ring oscillator may arrive at the end of the chain 672. This signal may then be captured and processed by on-board logic 670, transferred off the integrated circuit via output pin 678 for capture and processing by external logic, or both.

Figure 8:
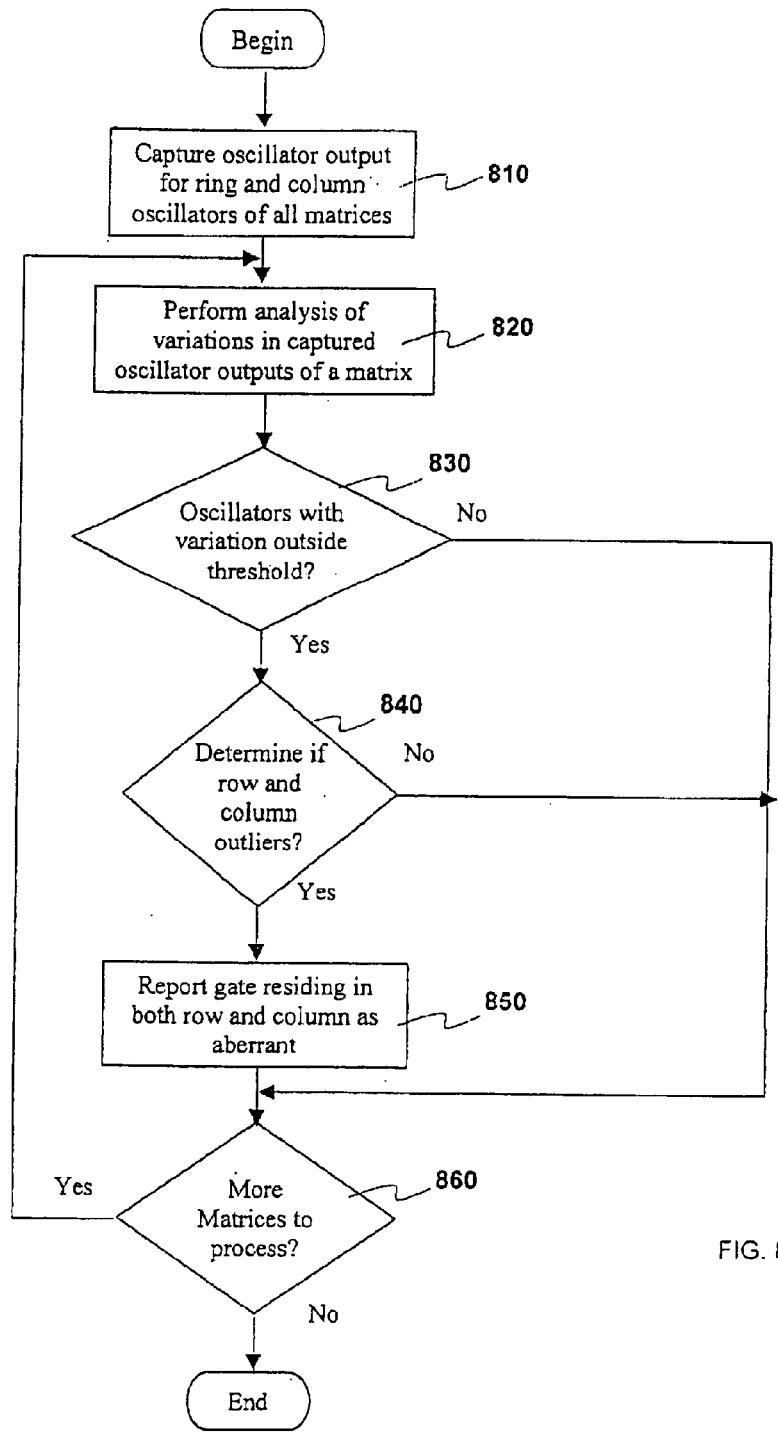
FIG. 8 illustrates a flow diagram for processing output from ring oscillator matrices, in accordance with one embodiment.

FIG. 8 illustrates a flow diagram for processing output from ring oscillator matrices, in accordance with one embodiment. Processing of the output from ring oscillator matrices may provide a variety of information regarding the circuit. For example, if we design the row ring oscillators and the column ring oscillators to be substantially identical, then by looking at variations in the frequencies, we may perform aberrant gate detection. Assume, for example, a 7 row, 7 column matrix of inversion stages forming row and column ring oscillators as discussed in association with FIGS. 6 and 7. First the oscillator outputs for each row and column ring oscillator of each matrix are captured, at 810. We can determine a measure of an oscillators frequency by counting the oscillations that occur during a known period of time. Refer again to the embodiment illustrated in connection with FIG. 6. In support of counting the oscillations that occur during a precise, known period of time, on-chip logic 670 may contain a counter for counting the number of oscillations. TAP controller 610 provides a counter begin and end indication via signals 680. Thus, after the oscillators of an enabled logic block have been running such that the oscillating signal may be available at on-chip logic 670, a begin pulse may be asserted to on-chip logic via signal 680 to indicate that a counter may begin counting signal oscillations. At a time later, an end pulse may be deasserted to indicate that the counter may end counting signal oscillations. This count value may then be read by the TAP controller 610 via signals 682.

Analysis of the captured information for a matrix of inverting stages forming row and column ring oscillators is performed, at 820. For example, counts for each ring oscillator's oscillation frequency may be compared to one another. Based on this information, if a ring oscillator deviates from its expected value by a statistically significant amount, the ring oscillator may be flagged as an outlier. If there are outliers, at 830, a check may be made to determine if there is both a row and column outlier, at 840. If it is determined that a row ring oscillator and a column ring oscillator both are outliers, the inversion stage common to both may be flagged as aberrant, at 850. If there are remaining matrices in the design to be checked, the process may be repeated, at 860.

The implementations have thus far illustrated matrices with interconnect wires which are nearly equal in length and moderately short. The exception may be the wire between the last inversion stage and the first inversion stage in each of the rows and columns. In this case, a long wire exists to route the output of the last inversion stage back to the input of the first inversion stage of the row or column. This long link may create an imbalanced, large wire load on the last inversion stage.

Figure 9A:
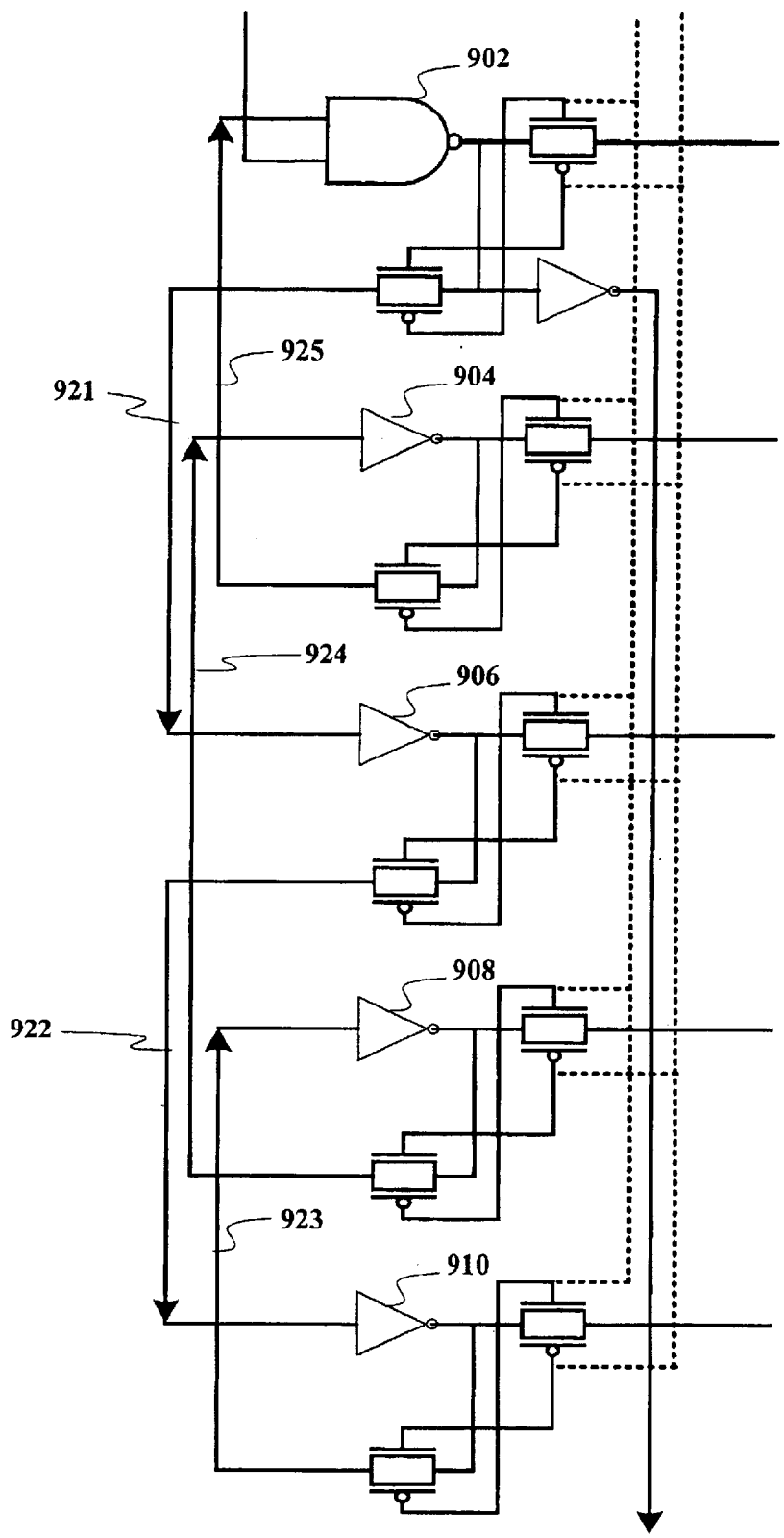
FIGS. 9A–9B illustrate interconnect patterns where the inverting stages are interconnected in an alternating sequence, in accordance with multiple embodiments.
Figure 9B:
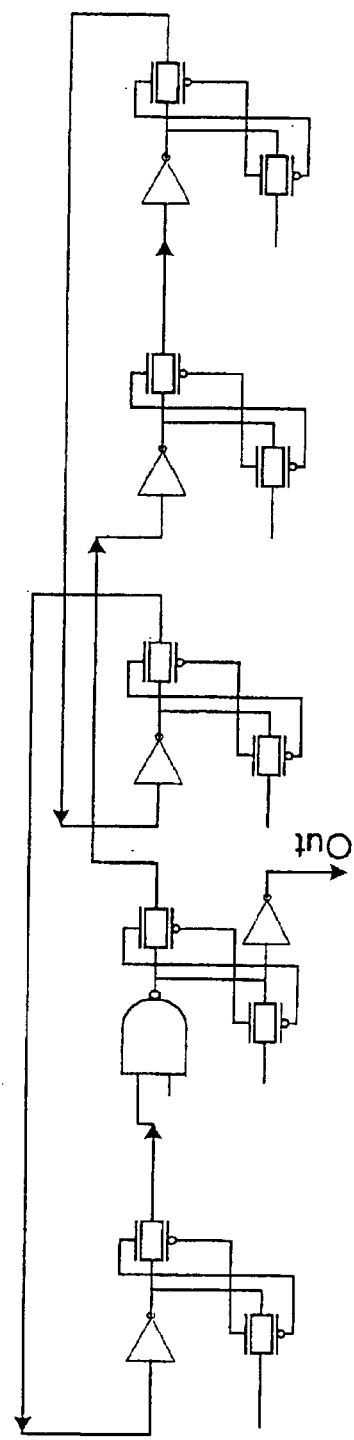

FIG. 9A illustrates an interconnect pattern where the inversion stages are interconnected in a more balanced manner, in accordance with one embodiment. In this embodiment, first inversion stage 902 drives third inversion stage 906 through wire 921. Third inversion stage 906 drives fifth inversion stage 910 through wire 922. Fifth inversion stage 910 drives fourth inversion stage 908 through wire 923. Fourth inversion stage 908 drives second inversion stage 904 through wire 924. Second inversion stage 904 drives first inversion stage 902 through wire 925. In this manner, the lengths of the wires between inversion stages may be more uniform. Moreover, the shorter wires may be meandered, slightly, to attempt to balance wire lengths. A similar scheme for a row ring oscillator is illustrated in FIG. 9B. It will be appreciated by those skilled in the art that other interconnect options can be exercised that may also create more uniform wire lengths.

Figure 10A:
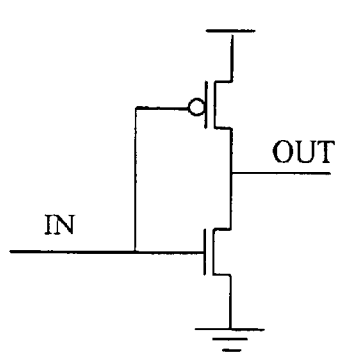
FIGS. 10A–10B illustrate two different gate types for a Complementary Metal-Oxide Semiconductor (CMOS) inverter design used in a matrix, in accordance with multiple embodiments.
Figure 10B:
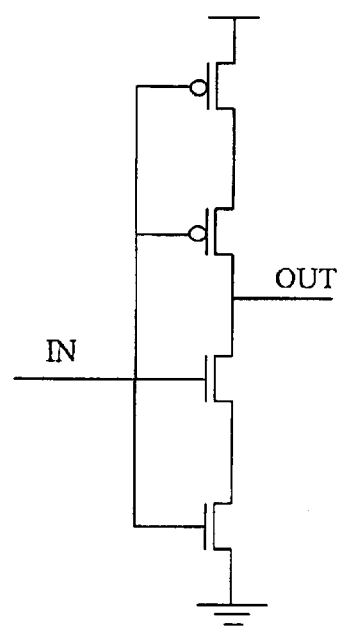

In the testing of ring oscillators for aberrant gate delay, different gate types may be used within a matrix. For example, illustrated previously, in a five-inversion stage implementation, there were four inverters and a NAND gate. In various embodiments, the inverters may be of different gate types. FIGS. 10A–10B illustrate two different gate types for a Complementary Metal Oxide Semiconductor (CMOS) inverter design used in a matrix, in accordance with one embodiment. FIG. 10A illustrates a static, single stage inverter design, comprising a single P-type Metal Oxide Semiconductor (PMOS) device and a single N-type Metal Oxide Semiconductor (NMOS). FIG. 10B illustrates a static, stacked inverter containing two PMOS and two NMOS devices. These illustrate various embodiments of inverter types that may be used.

FIGS. 11A–11B illustrate graphically the structure of a matrix comprising different gate types, in accordance with multiple embodiments. Using different gate types in the design may indicate that care should be utilized in the design of the matrix structure. As previously mentioned, while not required, it may be desirable to have row ring oscillators and column ring oscillators that oscillate at approximately the same frequency. If the different gate types were structured such that a row contained inverters all of inverter type $I_A$ and another row contained inverters all of type $I_B$ and so forth, the column ring oscillators may differ from the row ring oscillators. That is, the row ring oscillators may have four inverters of a particular type whereas the column oscillators may have an inverter of each of the four types as it may have one of $I_A$, $I_B$, $I_C$, and $I_D$ from each row. This may result in the row ring oscillators and column ring oscillators having significantly different frequencies. While analysis on this type of structure is possible, the analysis may be more complicated than analysis on other layouts containing varied gate types.

By staggering the inverter types as illustrated in FIG. 11A, we maintain the same gate types in the row ring oscillators and column ring oscillators. Illustrated is a five row, five column matrix. NAND gate 1110 is comprised of NAND type X. The four inverters $I_A$–$I_D$ comprise four different types of inverters. For example, inverter $I_A$ 1120 can be of the type illustrated in FIG. 10A whereas inverter $I_B$ 1130 may be of the type illustrated in FIG. 10B. By maintaining the same set of gate types in both the row ring oscillators and column ring oscillators, we can maintain similar operating frequencies between them. Note that by having the column oscillators oscillate upwards 1170, we may also gain the feature where, not only do the row ring oscillators and column ring oscillators have the same gates, but also their varied stages may drive each other in the same order. In addition, the specific arrangement of gate types illustrated in FIG. 11B facilitates operation of staggered gate arrangements as discussed with respect to FIGS. 9A and 9B above.

Figure 12:
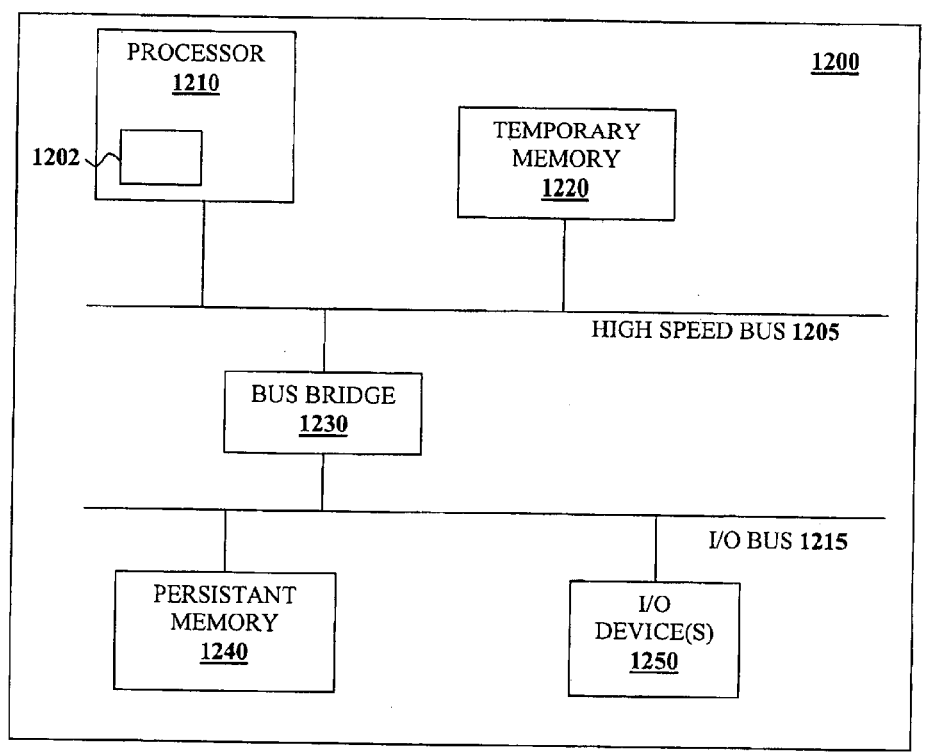
FIG. 12 illustrates a block diagram of a computer system having ring oscillator matrices of the present invention.

FIG. 12 illustrates a block diagram of an electronic device 1200 having ring oscillator matrices 1202 of the present invention. As shown, the electronic device 1200 includes a processor 1210 and temporary memory 1220, such as SDRAM and DRAM, on high-speed bus 1205. High-speed bus is connected through bus bridge 1230 to input/output (I/O) bus 1215. I/O bus 1215 connects persistent memory 1240, such as flash devices and fixed disk devices, and I/O devices 1250 to each other and bus bridge 1230.

EPILOG

Thus, a novel method and apparatus using ring oscillators comprising inversion stages in a matrix for aberrant logic gate timing observation, is disclosed.

While the present invention has been described as being particularly useful in determining aberrant gates, in particular, their timing, in an integrated circuit, the present invention may also be employed to facilitate other analyses and/or evaluations of the integrated circuit.

What is claimed is:

1. An apparatus comprising:
   a plurality of row ring oscillators;
   a plurality of column ring oscillators; and
   control logic coupled to said plurality of row ring oscillators and to said plurality of column ring oscillators to enable a selected ring oscillator of either said plurality of row ring oscillators or said plurality of column ring oscillators.

2. The apparatus of claim 1 further comprising output logic coupled to said plurality of row ring oscillators and to said plurality of column ring oscillators to facilitate output of a signal generated by said enabled ring oscillator.

3. The apparatus of claim 1 wherein at least one of said plurality of row ring oscillators comprise an odd number, N, of horizontally-coupled inversion stages and at least one of said plurality of column ring oscillators comprises an odd number, M, of vertically-coupled inversion stages, said plurality of row ring oscillators and said plurality of column ring oscillators sharing at least one inversion stage.

4. The apparatus of claim 3 wherein at least one of said plurality of row ring oscillators further comprises a first plurality of pass gate circuitries and at least one of said plurality of column ring oscillators further comprises a second plurality of pass gate circuitries.

5. The apparatus of claim 4 wherein at least one of said pass gate circuitries comprises a CMOS pass gate.

6. The apparatus of claim 4 wherein at least one pass gate circuitry from said first plurality of pass gates circuitries is coupled between two of said horizontally-coupled inversion stages and wherein at least one pass gate circuitry from said second plurality of pass gates circuitries is coupled between two of said vertically-coupled inversion stages.

7. The apparatus of claim 3 wherein said plurality of row ring oscillators and said plurality of column ring oscillators comprises at least one inversion stage having a plurality of inputs.

8. The apparatus of claim 3 wherein at least one of said inversion stages comprises a multiple input logic gate having logically coupled inputs.

9. The apparatus of claim 1 wherein said plurality of row ring oscillators and said plurality of column ring oscillators comprise inversion stages and at least one inversion stage comprises a selected one of an analog inversion stage and a bipolar inversion stage.

10. An apparatus An apparatus comprising: a plurality of circuit blocks including: a plurality of row ring oscillators, a plurality of column ring oscillators, and first control logic coupled to said plurality of row ring oscillators and to said plurality of column ring oscillators; second control logic coupled to said plurality of circuit blocks to enable a selected ring oscillator of either said plurality of row ring oscillators or said plurality of column ring oscillators; interconnect resources coupled to said plurality of circuit blocks; and first output logic coupled to said interconnect resources.

11. The apparatus of claim 10 wherein said plurality of circuit blocks include second output logic coupled to said plurality of row ring oscillators and to said plurality of column ring oscillators.

12. The apparatus of claim 10 wherein at least one of said plurality of row ring oscillators comprises an odd number, N, of horizontally coupled inversion stages and at least one of said plurality of column ring oscillators comprises an odd number, M, of vertically coupled inversion stages, said plurality of row ring oscillators and said plurality of column ring oscillators sharing inversion stages.

13. The apparatus of claim 12 wherein at least one of said plurality of row ring oscillators further comprises a first plurality of pass gate circuitries and at least one of said plurality of column ring oscillators further comprises a second plurality of pass gate circuitries.

14. The apparatus of claim 13 wherein at least one pass gate circuitry from said first plurality of pass gates circuitries is coupled between two of said horizontally-coupled inversion stages and wherein at least one pass gate circuitry from said second plurality of pass gates circuitries is coupled between two of said vertically-coupled inversion stages.

15. The apparatus of claim 12 wherein at least one of said plurality of row ring oscillators and at least one of said plurality of column ring oscillators comprises at least one logic stage having a plurality of inputs.

16. The apparatus of claim 12 wherein at least one of said inversion stages comprises a multiple input logic gate having logically coupled inputs.

17. The apparatus of claim 10 where, in at least one of said plurality of row ring oscillators in a selected logic block, an output from at least one inversion stage is connected through a pass gate to an input of a non-adjacent inversion stage.

18. The apparatus of claim 10 where, in at least one of said plurality of column ring oscillators in a selected logic block, an output from at least one inversion stage is connected through a pass gate to an input of a nonadjacent inversion stage.

19. The apparatus of claim 11 wherein said second output logic comprises multiplexer logic to facilitate the output of a signal generated by an enabled ring oscillator.

20. The apparatus of claim 10 wherein said interconnect resources are to couple together said plurality of circuit blocks to form a sequential chain of circuit blocks.

21. The apparatus of claim 20 wherein said first output logic comprises count logic coupled to said sequential chain of circuit blocks.

22. A system comprising: a processor including; a plurality of circuit blocks including; a plurality of row ring oscillators, a plurality of column ring oscillators, and first control logic coupled to said plurality of row ring oscillators and to said plurality of column ring oscillators, second control logic coupled to said plurality of circuit blocks to enable a selected ring oscillator of either said plurality of row ring oscillators or said plurality of column ring oscillators; interconnect resources coupled to said plurality of circuit blocks; and first output logic coupled to said interconnect resources; a memory configured to store data; and a bus coupled to the processor and memory to facilitate data exchange between the processor and memory.

23. The system of claim 22 wherein said plurality of circuit blocks include second output logic coupled to said plurality of row ring oscillators and to said plurality of column ring oscillators.

24. The system of claim 22 wherein at least one of said plurality of row ring oscillators comprises an odd number, N, of horizontally coupled inversion stages and at least one of said plurality of column ring oscillators comprises an odd number, M, of vertically coupled inversion stages, said plurality of rows and said plurality of columns sharing inversion stages.

25. The system of claim 22 wherein at least one of said plurality of row ring oscillators comprises a first plurality of pass gate circuitries and at least one of said plurality of column ring oscillators further comprises a second plurality of pass gate circuitries.

26. The system of claim 25 wherein at least one pass gate circuitry from said first plurality of pass gates circuitries is coupled between two of said horizontally-coupled inversion stages and wherein at least one pass gate circuitry from said second plurality of pass gates circuitries is coupled between two of said vertically-coupled inversion stages.

27. The system of claim 22 wherein said plurality of row ring oscillators and said plurality of column ring oscillators comprises at least one logic stage having a plurality of inputs.

28. A method comprising:
receiving oscillation information for a plurality of row ring oscillators;
receiving oscillation information for a plurality of column ring oscillators;
determining if at least one row ring oscillator and at least one column ring oscillator exhibit outlier timing behavior; and
determining which of a plurality of inversion stages is common to both an outlying row ring oscillator and an outlying column ring oscillator.

29. The method of claim 28 wherein said oscillation information comprises a count of a number of oscillations of a ring oscillator in a known period of time.

30. The method of claim 28 wherein said row ring oscillators comprise a first plurality of inversion stages and said column ring oscillators comprise a second plurality of inversion stages, said first plurality of inversion stages and said second plurality of inversion stages sharing at least one inversion stage.

* * * * *

UNITED STATES PATENT AND TRADEMARK OFFICE
CERTIFICATE OF CORRECTION

PATENT NO. : 6,891,442 B2  
APPLICATION NO. : 10/610856  
DATED : May 10, 2005  
INVENTOR(S) : Allen et al.

Page 1 of 1

It is certified that error appears in the above-identified patent and that said Letters Patent is hereby corrected as shown below:

<u>In the Claims</u>:
Col. 9, line 44, "...pass gates circuitries..." should read --...pass gate circuitries...--;
Col. 9, line 47, "...pass gates circuitries..." should read --...pass gate circuitries...--;
Col. 9, line 61, "10. An apparatus An apparatus..." should read --10. An apparatus...--;
Col. 10, line 21, "...pass gates circuitries..." should read --...pass gate circuitries...--;
Col. 10, line 24, "...pass gates circuitries..." should read --...pass gate circuitries...--;
Col. 10, line 36, "...non-adjacent..." should read --...nonadjacent... --;
Col. 11, line 14, "...pass gates circuitries" should read --...pass gate circuitries...--; and
Col. 11, line 17, "...pass gates circuitries" should read --...pass gate circuitries...--.

Signed and Sealed this

Twelfth Day of September, 2006

JON W. DUDAS  
*Director of the United States Patent and Trademark Office*